(12) United States Patent
Leobandung

(10) Patent No.: US 10,818,838 B1
(45) Date of Patent: Oct. 27, 2020

(54) PHASE CHANGE MEMORY

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/381,375

(22) Filed: Apr. 11, 2019

(51) Int. Cl.
  *H01L 27/02* (2006.01)
  *H01L 45/00* (2006.01)

(52) U.S. Cl.
  CPC ............ *H01L 45/126* (2013.01); *H01L 45/06* (2013.01); *H01L 45/144* (2013.01); *H01L 45/148* (2013.01); *H01L 45/16* (2013.01)

(58) Field of Classification Search
  CPC ..... H01L 45/06; H01L 45/126; H01L 45/148; H01L 45/144; H01L 27/2436
  See application file for complete search history.

(56) References Cited

U.S. PATENT DOCUMENTS

| | | | |
|---|---|---|---|
| 7,879,645 B2 | 2/2011 | Lung et al. | |
| 8,101,456 B2 | 1/2012 | Breitwisch et al. | |
| 8,426,967 B2 | 4/2013 | Joseph et al. | |
| 8,633,464 B2 | 1/2014 | Breitwisch et al. | |
| 8,686,391 B2 | 4/2014 | Schrott et al. | |
| 8,728,859 B2 | 5/2014 | Breitwisch et al. | |
| 8,860,111 B2 | 10/2014 | Lung et al. | |
| 9,627,612 B2 | 4/2017 | BrightSky et al. | |
| 2007/0285962 A1 | 12/2007 | Yen et al. | |

OTHER PUBLICATIONS

Breitwisch, "Phase Change Memory", IBM/Macronix PCRAM Joint Project, 2008, pp. 219-221, IEEE 987-1-4244-1911-1, Yorktown Heights, NY USA.

*Primary Examiner* — Savitri Mulpuri
(74) *Attorney, Agent, or Firm* — Erik K. Johnson

(57) ABSTRACT

An embodiment of the invention may include a method of forming, and the resulting semiconductor structure. The method may include removing a portion of an $M_{x+1}$ layer insulator above an $M_x$ conductive layer located in an $M_x$ layer insulator. The method may include depositing an Mx+1 conductive layer in the removed portion of the $M_{x+1}$ layer insulator. The method may include removing a portion of Mx+1 conductive layer to form a first portion of $M_{x+1}$ conductive layer. The method may include forming spacers above the first portion of $M_{x+1}$ conductive layer and in the removed portion of the $M_{x+1}$ layer insulator. The method may include forming a second $M_{x+1}$ conductive layer. The method may include forming a phase change material on the second $M_{x+1}$ conductive layer.

8 Claims, 4 Drawing Sheets

US 10,818,838 B1

PHASE CHANGE MEMORY

BACKGROUND

The present invention relates to semiconductor devices, and particularly to forming heating elements for phase change materials.

Phase change memory (PCM) devices store data using a phase change material, such as, for example, a chalcogenide alloy, that transforms into a crystalline state or an amorphous state. An electrode may provide a current through the PCM device to produce heat that effectuates phase changes in the PCM between the crystalline and the amorphous phases. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1".

SUMMARY

An embodiment of the invention may include a method of forming a semiconductor structure. The method may include removing a portion of an $M_{x+1}$ layer insulator above an $M_x$ conductive layer located in an $M_x$ layer insulator. The method may include depositing an Mx+1 conductive layer in the removed portion of the $M_{x+1}$ layer insulator; The method may include removing a portion of Mx+1 conductive layer to form a first portion of $M_{x+1}$ conductive layer. The method may include forming spacers above the first portion of $M_{x+1}$ conductive layer and in the removed portion of the $M_{x+1}$ layer insulator. The method may include forming a second $M_{x+1}$ conductive layer above the first portion of $M_{x+1}$ conductive layer and in the removed portion of the $M_{x+1}$ layer insulator. The method may include forming a phase change material on the second $M_{x+1}$ conductive layer.

An embodiment of the invention may include a method of forming a semiconductor structure comprising: removing a portion of an $M_{x+1}$ layer insulator above an $M_x$ conductive layer located in an Mx¬ layer insulator. The method may include depositing an $M_{x+1}$ conductive layer in the removed portion of the $M_{x+1}$ layer insulator; removing a portion of $M_{x+1}$ conductive layer. The method may include forming spacers above a remaining portion of $M_{x+1}$ conductive layer and in the removed portion of the $M_{x+1}$ layer insulator. The method may include removing the remaining portion of $M_{x+1}$ conductive layer. The method may include forming a second $M_{x+1}$ conductive layer in the removed portion of the $M_{x+1}$ layer insulator. The method may include forming a phase change material on the second $M_{x+1}$ conductive layer.

An embodiment of the invention may include a semiconductor structure. The structure may include an Mx conductive layer located in an $M_x$ layer insulator. The structure may include a phase change material heating element located in the $M_{x+1}$ conductive layer, where a width of a top surface of the phase change material heating element is smaller than a width of a bottom surface of the phase change material heating element. The structure may include a phase change material on the $M_{x+1}$ conductive layer.

Figure 1:
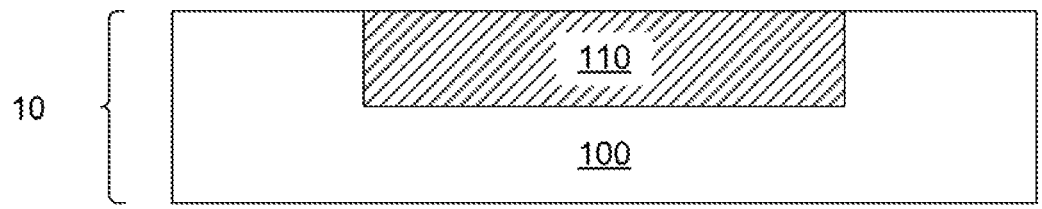
FIG. 1 depicts a cross sectional view of a starting substrate, where the starting substrate has a first conductive layer in an insulator level, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantially similar (and its derivatives such as, for example, about and approximately) denote a difference by a generally accepted engineering or manufacturing tolerance, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Phase change materials are useful in creating phase change memory for use in semiconductor devices. Such materials have the property that when they undergo a physical change, the resistance of the material changes which allows the material to act as a logical 1 or 0. Such changes may be performed by heating of the material to change the crystalline properties of the material to achieve the change in resistance. In certain embodiments of the current invention, this heating is performed by a resistive heating element located beneath phase change material. The resistive heating element may have a narrowed top portion closer to the phase change material, to enable heating primary heating of only the phase change material.

Referring to FIG. 1, $M_x$ level 10 contains an $M_x$ dielectric 100 and $M_x$ conductive material 110. The $M_x$ dielectric 100 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the $M_x$ dielectric 100. The $M_x$ dielectric 100 may have a thickness ranging from approximately 100 nm to approximately 500 nm and ranges there between, although a thickness less than 100 nm and greater than 500 nm may be acceptable.

With continued reference to FIG. 1, the $M_x$ conductive material 110 may be, for example, a typical line, via, or wire found in a typical interconnect structure. The $M_x$ conductive material 110 may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed in the $M_x$ level 10 between the $M_x$ conductive material 110 and the Mx dielectric 100. In one embodiment, a liner may include, for example, a tantalum nitride layer, followed by a tantalum layer. Other barrier liners may include cobalt or ruthenium, either alone or in combination with any other suitable liner. In some embodiments, $M_x$ conductive material 110 may be a line or a via.

Figure 2:
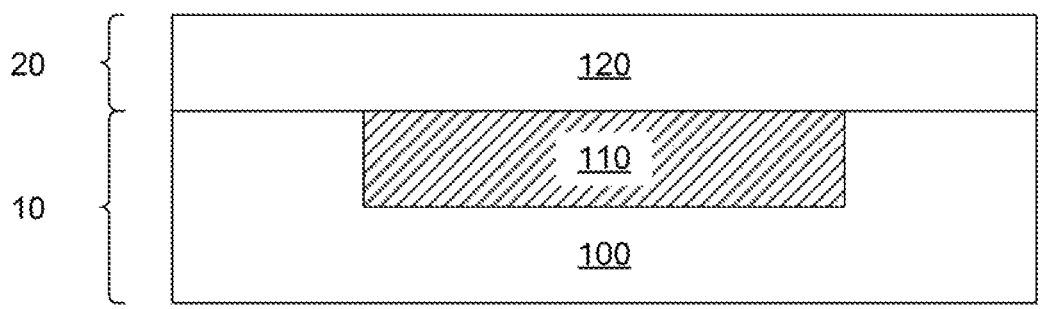
FIG. 2 depicts a cross sectional view of following depositing a second insulator level, according to an exemplary embodiment.

Referring to FIG. 2, $M_{x+1}$ level 20 may be formed containing an $M_x$ dielectric 120. The $M_{x+1}$ dielectric 120 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the $M_x$ dielectric 100. The $M_{x+1}$ dielectric 120 may each have a thickness ranging from approximately 100 nm to approximately 150 nm and ranges there between, although a thickness less than 100 nm and greater than 150 nm may be acceptable.

Figure 3:
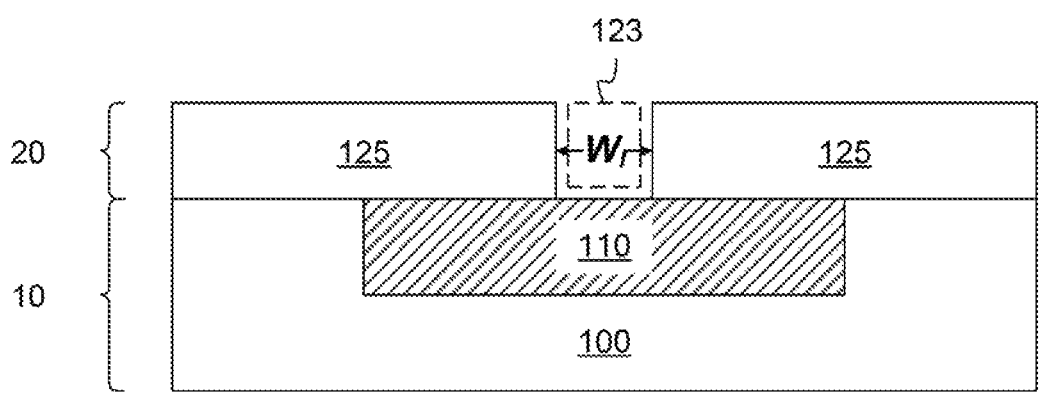
FIG. 3 depicts a cross sectional view of following removing a portion of the second insulator level above the first conductive layer, according to an exemplary embodiment.

Referring to FIG. 3, a trench 123 may be formed in the $M_{x+1}$ dielectric 120 using typical etching techniques, including, for example, the removal of the dielectric may be performed by patterning a lithographic mask above $M_{x+1}$ dielectric 120, and performing an anisotropic etch, such as a RIE etch, to remove the material below the unpatterned portion of the lithographic mask. In some embodiments, including the depicted embodiment, the trench 230 extends through the $M_{x+1}$ layer 20 exposing $M_x$ conductive material 110 of the $M_x$ layer 10. The trench 123 may be formed such that the width of the opening, $W_f$, is approximately 10 nm to approximately 50 nm although other width is possible.

Figure 4:
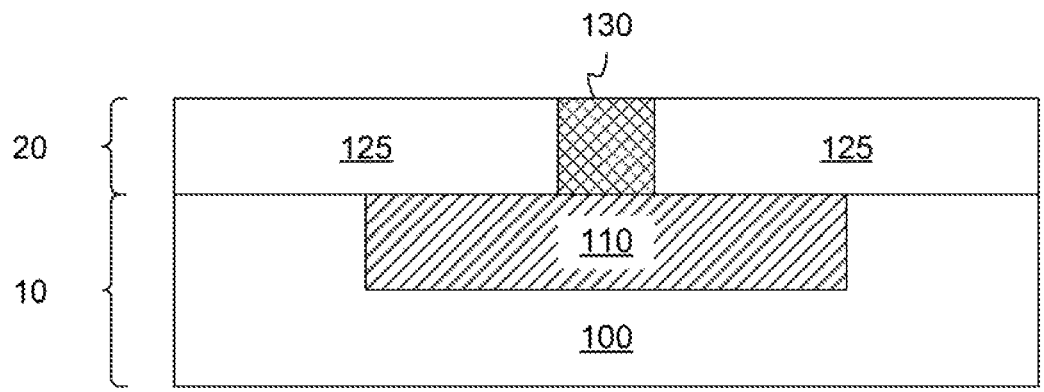
FIG. 4 depicts a cross sectional view following depositing a second conductive layer above the first conductive layer, according to an exemplary embodiment.

Referring to FIG. 4, a $M_{x+1}$ conductive material 130 may be formed in the void. The $M_{x+1}$ conductive material 130 may include, for example, copper, aluminum, titanium nitride, tantalum nitride or tungsten. The $M_{x+1}$ conductive material 130 may be formed using a filing technique such as electroplating, electroless plating, chemical vapor deposition, physical vapor deposition or a combination of methods.

Figure 5:
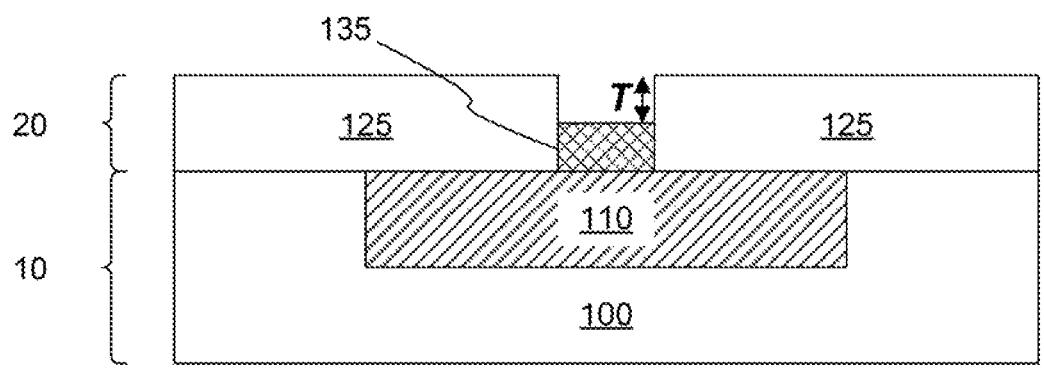
FIG. 5 depicts a cross sectional view following removing a portion of the second conductive layer, according to an exemplary embodiment.

Referring to FIG. 5, $M_{x+1}$ conductive material 130 may be recessed to form bottom portion of a heating element 135. The $M_{x+1}$ conductive material 130 may be recessed using any suitable process such as, for example, wet etch or RIE. In an embodiment, the thickness of $M_{x+1}$ conductive material 130, T, and representing the recessed depth of the conductive material 130, may be 20 nm to 100 nm. In an embodiment the thickness of $M_{x+1}$ conductive material 130, T, may be 10 to 80% of the total thickness $M_{x+1}$ layer 20, representing the amount of the resulting structure that creates resistive heating.

Figure 6:
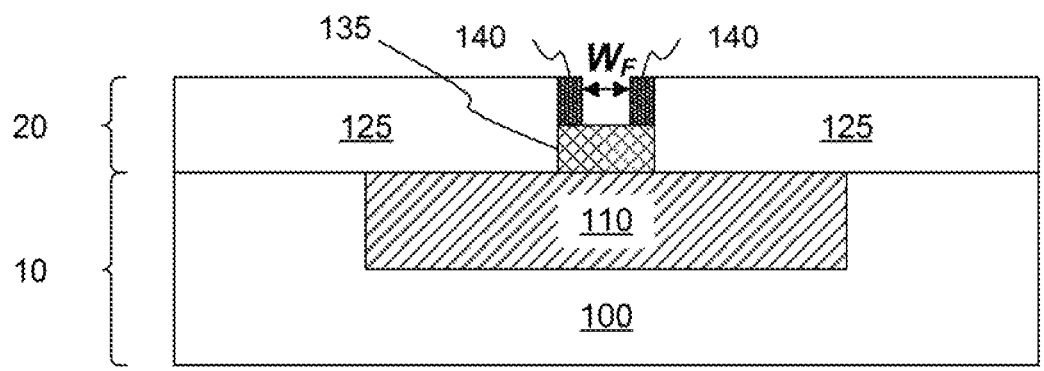
FIG. 6 depicts a cross sectional view following depositing spacers above the second conductive layer, according to an exemplary embodiment.

Referring to FIG. 6, spacers 140 may be formed above the bottom portion of the heating element 135. The spacers 140 may be formed adjacent to the exposed vertical surfaces of the $M_{x+1}$ dielectric 125 and cover a portion of the surface of bottom portion of the heating element 135. The spacers 140 may be made of any suitable insulating material, such as silicon nitride, silicon oxide, silicon oxynitrides, or a combination thereof, and may have a thickness ranging from 2 nm to approximately 100 nm. The spacers 140 may be formed by any method known in the art, including depositing a conformal insulating layer over $M_{x+1}$ dielectric 125 and bottom portion of the heating element 135 and anisotropically etching the material from the horizontal surfaces. As used herein, an "anisotropic etch process" denotes a material removal process in which the etch rate in the direction normal to the surface to be etched is greater than in the direction parallel to the surface to be etched. Reactive Ion Etching (RIE) is a form of plasma etching, in which during etching the surface to be etched is placed on the RF powered electrode, wherein the surface to be etched takes on a potential that accelerates the etching species extracted from a plasma toward the surface to be etched, in which the chemical etching reaction is taking place in the direction normal to the surface. Further, in various embodiments, the spacers 140 may include one or more layers. Spacers 140 may be formed such that the width, WF, of the opening is approximately 3 nm to approximately 20 nm. Such widths may be used to create sufficient resistive heating through a top portion of the heating element 150 that is formed in FIG. 7.

Figure 7:
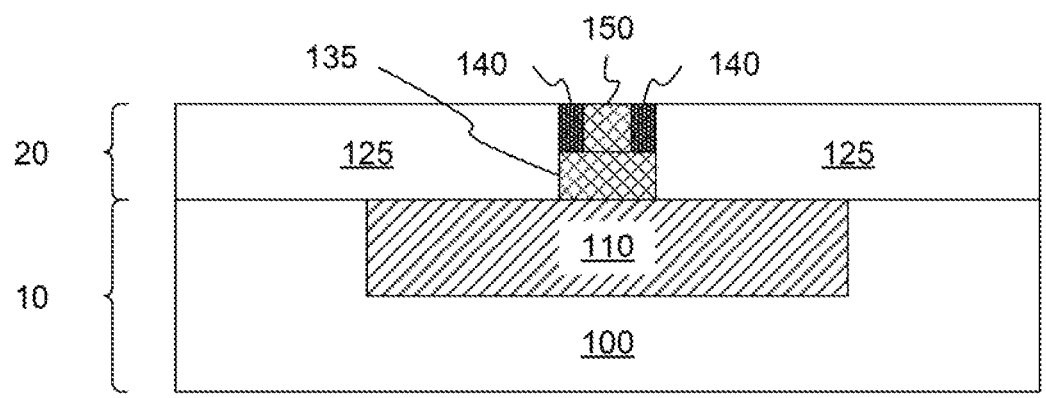
FIG. 7 depicts a cross sectional view following depositing a third conductive layer above the second conductive layer between the spacers, according to an exemplary embodiment.

Referring to FIG. 7, a top portion of the heating element 150 may be formed in the void. The top portion of the heating element 150 may include, for example, copper, aluminum, titanium nitride, tantalum nitride or tungsten. The top portion of the heating element 150 may be formed using a filing technique such as electroplating, electroless plating, chemical vapor deposition, physical vapor deposition or a combination of methods.

Figure 8:
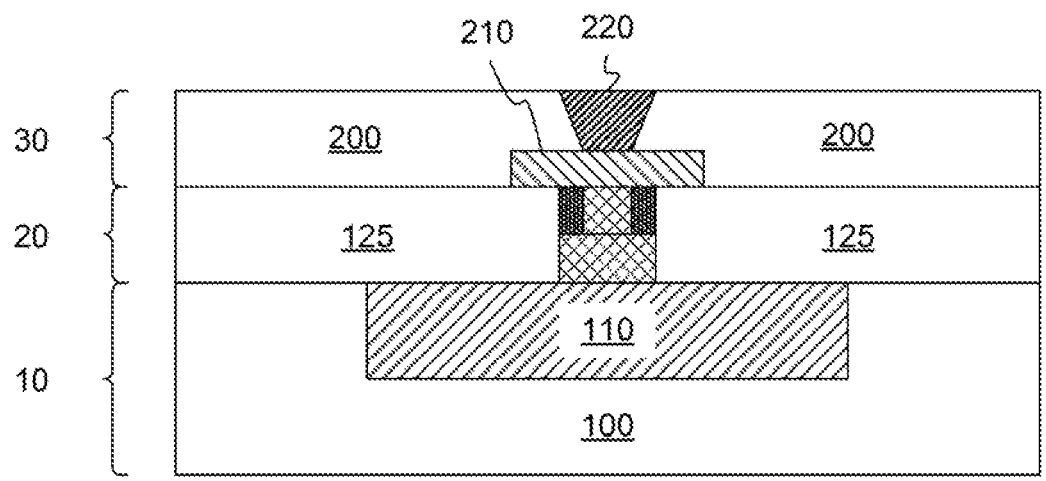
FIG. 8 depicts a cross sectional view following forming connections to phase change memory, according to an exemplary embodiment.

Referring to FIG. 8, in an $M_{x+2}$ layer 30, $M_{x+2}$ dielectric 200, phase change material 210 and $M_{x+2}$ conductive material 220 may be formed following the formation of the top portion of the heating element 150. The phase change material 210 is formed in electrical communication with the top portion of the heating element 150. In one embodiment, the phase change material 210 is formed in direct physical contact with the top portion of the heating element 150. In another embodiment, the phase change material 210 may be formed overlying the top portion of the heating element 150, wherein an interface layer, such as a diffusion barrier may be positioned between the phase change material 210 and the top portion of the heating element 150.

The thickness of the phase change material 210 may range from about 5 nm to about 400 nm. The deposition of the phase change material 210 may include blanket deposition followed by planarization, forming a phase change layer. In a following process step, a portion of the phase change layer is removed to provide phase change material 210. In one embodiment, following formation of a photoresist mask, the exposed portions of the phase change layer are etched using an anisotropic etch process, e.g., reactive ion etching.

In one embodiment, the phase change material 210 may be switched from an amorphous phase to a crystalline phase. When in an amorphous state, the phase change material 210 exhibits a high resistivity. In one embodiment, the amorphous resistivity may range from $10^2$ ohm-m to $10^4$ ohm-m. When in a crystalline state, the phase change material 210 is more conductive, typically exhibiting a lower resistivity by a factor of 10-10000. The phase change material 210 may include chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material has a composition of $Ge_2Sb_2Te_5$ (GST). Although chalcogenides are a group of materials commonly utilized as phase change material, some phase change materials, such as GeSb, do not utilize, chalcogenides. In one embodiment, the layer of the first phase change material is composed of GeSbTe (GST), GeSb, SbTe, GeTe, GeGaSb, SiSbTe, AgInSbTe or a combination thereof. In one embodiment, the phase change material 210 is undoped. The term undoped means that the phase change material is substantially free of dopants and impurities. The term substantially free of dopants and impurities means that dopants are present in less than 1.0 wt %.

With continued reference to FIG. 8, an $M_{x+2}$ dielectric 200 may be deposited over the structure, and subsequent damascene or dual damascene structures may be created. The $M_{x+2}$ dielectric 200 may electrically insulate the phase change material 210 from additional interconnect levels (not shown) that may be subsequently formed above the phase change material 210. The $M_{x+2}$ dielectric 200 may be deposited using typical deposition techniques, for example, chemical vapor deposition. The $M_{x+2}$ dielectric 200 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+2}$ dielectric 200 may have a thickness ranging from about 50 nm to about 600 nm and ranges there between, although a thickness less than 50 nm and greater than 600 nm may be acceptable.

Still referring to FIG. 8, a damascene opening may be formed in the $M_{x+2}$ dielectric 200. The damascene opening may include a trench opening or two via openings. The damascene opening may be formed using any suitable masking and etching technique known in the art. In one embodiment, a dry etching technique using a fluorine-based etchant, such as, for example $C_xF_y$, may be used. In one embodiment, the depth of the trench opening may range from about 50 nm to about 100 nm. An $M_{x+2}$ conductive material 220 may be fill the void. The Mx+1 conductive material 130 may include, for example, copper, aluminum, titanium nitride, tantalum nitride or tungsten. The $M_{x+2}$ conductive material 220 may be formed using a filing technique such as electroplating, electroless plating, chemical vapor deposition, physical vapor deposition or a combination of methods.

Still referring to FIG. 8, a structure is formed in which a heating element, formed by bottom portion of the heating element 135 and top portion of the heating element 150, is located above conductive element 110, such as a line or via, and a phase change material 210. The width WF of the bottom portion of the heating element 135, is defined by spacers 140 with a bottom surface defined by a top surface of the top portion of the heating element 150. Such a structure may allow for resistive heating of a phase change material 210 from the level below the phase change material (e.g. the $M_{x+1}$ level). Phase change material 210 may be electrically connected through other portions of the semiconductor device through $M_{x+2}$ conductive material 220, which may allow phase change material to be used as phase change memory in the semiconductor device, having a heating element located beneath the phase change memory.

Figure 9:
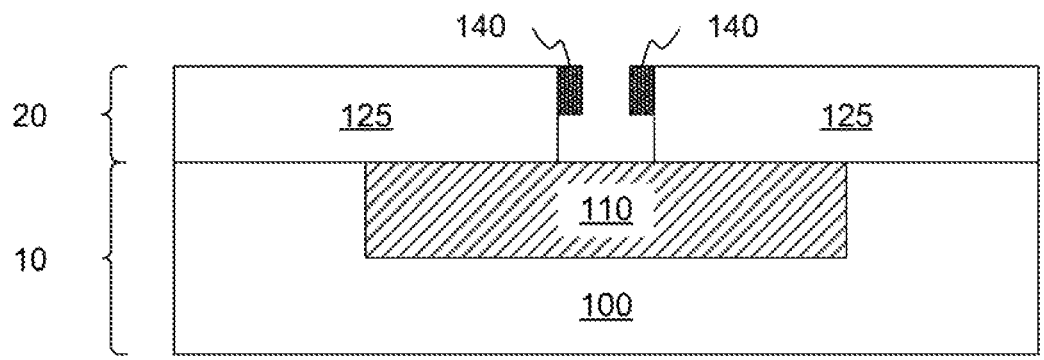
FIG. 9 depicts a cross sectional view of another embodiment following removing the second conductive layer remaining in FIG. 6, according to an exemplary embodiment.

Referring to FIG. 9, in a separate embodiment following FIG. 6, the conductive material 135 may be completely removed. Conductive material 135 may be removed using any suitable process such as, for example, wet etch or RIE.

Figure 10:
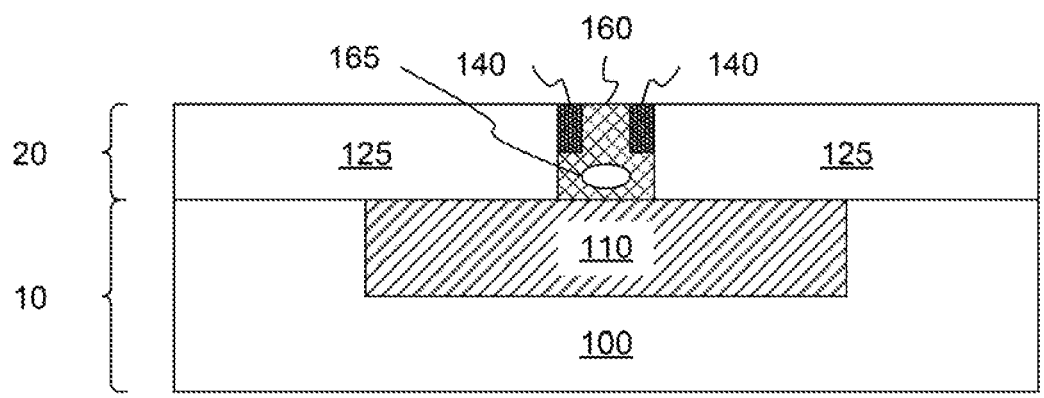
FIG. 10 depicts a cross sectional view following depositing a fourth conductive layer, according to an exemplary embodiment.

Referring to FIG. 10, a conductive material 160 may be formed in the space in $M_{x+1}$ dielectric 125 and spacers 140. The conductive material 160 may include, for example, copper, aluminum, titanium nitride, tantalum nitride or tungsten. The conductive material 160 may be formed using a filing technique such as electroplating, electroless plating, chemical vapor deposition, physical vapor deposition or a combination of methods. By removing conductive material 135, and reforming conductive material 160, the conductive material 160 may have a uniform crystalline structure and may not experience issues between the interfaces of the two conductive materials formed separately. Additionally, filling the structure in this manner may cause an internal void 165 in the conductive material 160.

Figure 11:
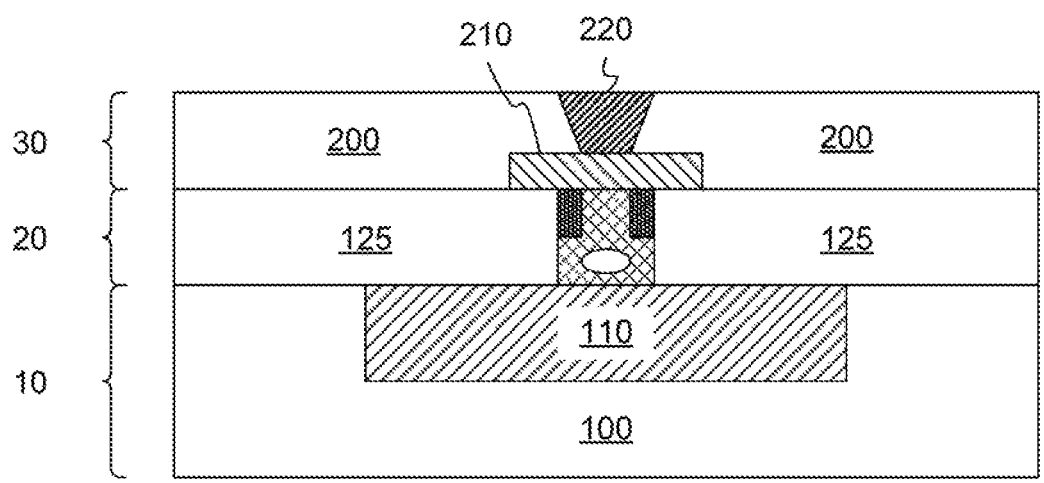
FIG. 11 depicts a cross sectional view following forming connections to phase change memory, according to an exemplary embodiment.

Referring to FIG. 11, in an $M_{x+2}$ layer 30, $M_{x+2}$ dielectric 200, phase change material 210 and $M_{x+2}$ conductive material 220 may be formed following the formation of the top portion of the heating element 150. The phase change material 210 is formed in electrical communication with the top portion of the heating element 150. In one embodiment, the phase change material 210 is formed in direct physical contact with the top portion of the heating element 150. In another embodiment, the phase change material 210 may be formed overlying the top portion of the heating element 150, wherein an interface layer, such as a diffusion barrier may be positioned between the phase change material 210 and the top portion of the heating element 150.

The thickness of the phase change material 210 may range from about 5 nm to about 400 nm. The deposition of the phase change material 210 may include blanket deposition followed by planarization, forming a phase change layer. In a following process step, a portion of the phase change layer is removed to provide phase change material 210. In one embodiment, following formation of a photoresist mask, the exposed portions of the phase change layer are etched using an anisotropic etch process, e.g., reactive ion etching.

In one embodiment, the phase change material 210 may be switched from an amorphous phase to a crystalline phase. When in an amorphous state, the phase change material 210 exhibits a high resistivity. In one embodiment, the amorphous resistivity may range from $10^2$ ohm-m to $10^4$ ohm-m. When in a crystalline state, the phase change material 210 is more conductive, typically exhibiting a lower resistivity by a factor of 10-10000. The phase change material 210 may include chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material has a composition of $Ge_2Sb_2Te_5$ (GST). Although chalcogenides are a group of materials commonly utilized as phase change material, some phase change materials, such as GeSb, do not utilize, chalcogenides. In one embodiment, the layer of the first phase change material is composed of GeSbTe (GST), GeSb, SbTe, GeTe, GeGaSb, SiSbTe, AgInSbTe or a combination thereof. In one embodiment, the phase change material 210 is undoped. The term undoped means that the phase change material is substantially free of dopants and impurities. The term substantially free of dopants and impurities means that dopants are present in less than 1.0 wt %.

With reference to FIG. 11, an $M_{x+2}$ dielectric 200 may be deposited over the structure, and subsequent damascene or dual damascene structures may be created. The $M_{x+2}$ dielectric 200 may electrically insulate the phase change material 210 from additional interconnect levels (not shown) that may be subsequently formed above the phase change material 210. The $M_{x+2}$ dielectric 200 may be deposited using typical deposition techniques, for example, chemical vapor deposition. The $M_{x+2}$ dielectric 200 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+2}$ dielectric 200 may have a thickness ranging from about 50 nm to about 600 nm and ranges there between, although a thickness less than 50 nm and greater than 600 nm may be acceptable.

Still referring to FIG. 11, a damascene opening may be formed in the $M_{x+2}$ dielectric 200. The damascene opening may include a trench opening or two via openings. The damascene opening may be formed using any suitable masking and etching technique known in the art. In one embodiment, a dry etching technique using a fluorine-based etchant, such as, for example $C_xF_y$, may be used. In one embodiment, the depth of the trench opening may range from about 50 nm to about 100 nm. An $M_{x+2}$ conductive material 220 may be fill the void. The Mx+1 conductive material 130 may include, for example, copper, aluminum, titanium nitride, tantalum nitride or tungsten. The $M_{x+2}$ conductive material 220 may be formed using a filing technique such as electroplating, electroless plating, chemical vapor deposition, physical vapor deposition or a combination of methods.

Still referring to FIG. 11, a structure is formed in which a heating element, formed by bottom portion of the heating element 135 and top portion of the heating element 150, is located above conductive element 110, such as a line or via, and a phase change material 210. The width WF of the bottom portion of the heating element 135, is defined by spacers 140 with a bottom surface defined by a top surface of the top portion of the heating element 150. Such a structure may allow for resistive heating of a phase change material 210 from the level below the phase change material (e.g. the $M_{x+1}$ level). Additionally, heating element 160 may have an internal void 165. Phase change material 210 may be electrically connected through other portions of the semiconductor device through $M_{x+2}$ conductive material 220, which may allow phase change material to be used as phase change memory in the semiconductor device, having a heating element located beneath the phase change memory.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
an $M_x$ conductive layer located in an $M_x$ layer insulator;
a phase change material heating element located in the $M_{x+1}$ layer, wherein a width of a top surface of the phase change material heating element is smaller than a width of a bottom surface of the phase change material heating element; and
a phase change material located in a $M_{x+2}$ layer in contact with the top surface of the phase change material heating element and in the $M_{x+1}$ layer, wherein the phase change heating element comprises a top portion of an Mx+i layer that is narrower than a bottom portion of the Mx+I layer, and wherein spacers surround the top portion of the Mx+i layer.

2. The semiconductor structure of claim 1, wherein the top portion of the $M_{x+1}$ layer and the bottom portion of the $M_{x+1}$ layer are a uniform structure.

3. The semiconductor structure of claim 2, wherein there is a void in the bottom portion.

4. The semiconductor structure of claim 1, wherein the top portion of the $M_{x+1}$ layer and the bottom portion of the $M_{x+1}$ layer are independently formed structures.

5. The semiconductor structure of claim 4, wherein the top portion of the $M_{x+1}$ layer and the bottom portion of the $M_{x+1}$ layer are made of different materials.

6. The semiconductor structure of claim 4, wherein the top portion of the $M_{x+1}$ layer and the bottom portion of the $M_{x+1}$ layer are made of the same material.

7. The semiconductor structure of claim 1, wherein the width of the top portion of the $M_{x+1}$ layer is approximately 3 nm to approximately 20 nm.

8. The semiconductor structure of claim 7, wherein the width of the bottom portion of the $M_{x+1}$ layer is approximately 10 nm to approximately 50 nm.

* * * * *